United States Patent [19]

Sarka

[11] 4,294,649

[45] Oct. 13, 1981

[54] METHOD OF MAKING DIE PLATES

[76] Inventor: Albert J. Sarka, 18828 Canyon Dr., Fairview Park, Ohio 44126

[21] Appl. No.: 91,361

[22] Filed: Nov. 5, 1979

[51] Int. Cl.³ .............................................. C23F 1/02
[52] U.S. Cl. ................................. 156/645; 156/659.1; 156/664; 430/306; 430/320; 430/323
[58] Field of Search ............ 156/626, 645, 656, 659.1, 156/654, 664; 83/17, 861, 875, 878; 76/107 C; 430/146, 306, 323, 327, 320

[56] References Cited

U.S. PATENT DOCUMENTS

| | | | |
|---|---|---|---|
| 3,236,708 | 2/1966 | Tillis | 156/659.1 |
| 3,402,083 | 9/1968 | Patsko et al. | 156/659.1 |
| 3,570,329 | 3/1971 | Schunemann | 156/645 |
| 3,690,199 | 9/1972 | Sarka | 156/659.1 |
| 3,758,350 | 9/1973 | Weglin | 156/659.1 |
| 3,891,437 | 6/1975 | Sarka | 156/659.1 |
| 3,895,947 | 7/1975 | Sarka | 156/656 |
| 3,905,817 | 9/1975 | Bakewell | 156/659.1 |
| 4,053,348 | 10/1977 | Weglin | 156/645 |

Primary Examiner—Jerome W. Massie
Attorney, Agent, or Firm—Yount & Tarolli

[57] ABSTRACT

The disclosure relates to a method of making a pair of die plates having raised lands which cooperate to cut or crease material pressed between them. A line drawing of the desired pattern of cuts and creases is converted to coded information which is fed to the memory of an automatic machine tool. The automatic machine tool then produces a master image of the pattern of cuts and creases by selectively removing an opaque layer from a light transmitting substrate. The width of the lines on the master image are controlled according to whether cuts or creases are to be made, the height of the lands to be formed and the chemical properties of the material of which the die plates are to be formed. The master image is used to control chemical etching of the die plates, and thereafter the automatic machine tool, controlled by the same coded information, forms the desired profile for the lands. In addition, special machining is performed where cutting lands intersect each other.

7 Claims, 15 Drawing Figures

METHOD OF MAKING DIE PLATES

BACKGROUND OF THE INVENTION

The present invention relates to a method of making die plates, particularly die plates used to cut and/or crease paper or cardboard.

Boxes and cartons for many products are made from heavy paper or cardboard. Machines have been developed which cut carton or box blanks from a web of heavy paper or cardboard. The blank may then be folded in an automatic folding machine or otherwise to form a box or carton.

The machines which cut the blanks utilize a pair of die plates mounted on rotatable cylinders to cut and/or crease the material as it passes through a nip defined by the two cylinders. Each die plate has lands which are raised above the surface of the rest of the die plate. Lands on one plate cooperate with those on the other plate to effect cutting. In the past cooperating lands have been made to overlap, but they do not touch each other as the rotating cylinders bring them into alignment. The lands effect "rupture cutting" of the material as it is passed through a nip defined by the cylinders. Creases may be formed in the material by locating a land on one die plate between two spaced apart lands on the cooperating die plate.

Numerous methods have been used in the past to form these die plates. Much effort has been devoted to developing a method of making die plates by which lands may be accurately located on one die plate for cooperation with lands on another die plate. Success in this effort has not been complete and inaccuracies persist as a problem. One successful method is the method disclosed in U.S. Pat. No. 3,895,947 issued to the present applicant. The known methods of making die plates are accompanied by certain drawbacks such as being expensive or laborious. For example, considerable manual labor and dexterity are required to practice the method of U.S. Pat. No. 3,895,947.

SUMMARY OF THE INVENTION

The present invention provides a method for forming lands which is both simple, fast and extremely accurate. The present invention utilizes automated equipment to produce die plates efficiently and rapidly. Once a designer has produced a line drawing of a carton to be made, the layout is converted to coded information which may be stored in the memory of an automatic machine tool. Additional coded information related to the chemical etching process used to make the die plates, where material is to be cut, and where it is to be creased is added to the memory. The machine tool is then used to scribe a master image by selectively removing an opaque coating from a transparent substrate. The width of the lines scribed in the master image is selected according to the types of cut or crease to be formed, the nature of the paperboard to be cut or creased, and the chemical properties of the material of which the die plates are formed.

A pair of blank metal die plates are then coated with a light hardenable material, the master image is laid over each plate, and then each plate is exposed through the master image. The coating is hardened by this exposure in the areas where the opaque layer has been removed, but elsewhere it remains soft. The exposed plates are then chemically etched, with the etchant effective to remove material from the plate only in those areas where the light hardenable coating was not exposed. Raised portions corresponding to the line drawing thus remain raised above the surface of the die plates while the balance of the surfaces are etched downward. Thereafter the same coded information is used to control the automatic machine tool to selectively remove material from the raised portions, converting the heretofore identical pair of die plates into a male and female die plate which will cooperate to cut and crease the material pressed between them in accordance with the designer's layout. The automatic machine tool finishes the dies by removing material from the sides of the raised portions to produce the desired profile for the lands, the proper spacing between cooperating cutting lands, and the proper spacing between cooperating creasing lands. The automatic machine tool may also be utilized to make special cuts where the cutting lines intersect each other.

In an alternative embodiment of the present invention, a separate master image is made for each one of a pair of cooperating die plates, i.e., one image for the male die plate and one for the female die plate. In this case the machine tool has less material to remove from the lands after they have been etched in order to form the finished lands with the desired spacing and profile.

BRIEF DESCRIPTION OF THE DRAWINGS

These and other essential features of the present invention will be apparent from the description below, and objects and advantages will be apparent to those skilled in the art to which the invention relates from the following description of the preferred embodiment of the present invention made with reference to the accompanying drawings in which.

DESCRIPTION OF A PREFERRED EMBODIMENT OF THE INVENTION

Figure 1:
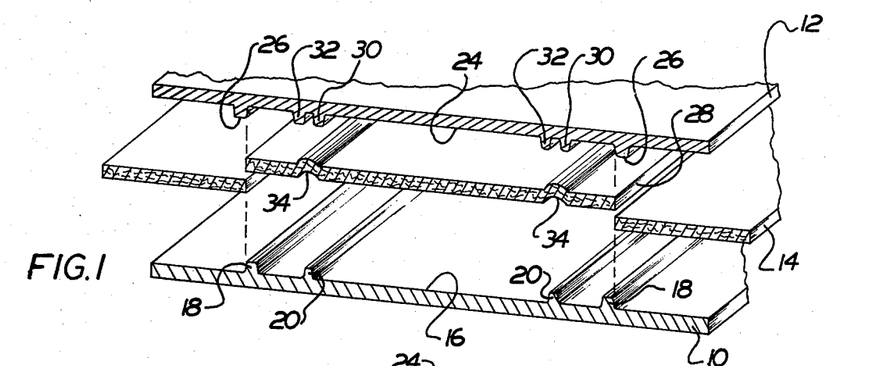
FIG. 1 illustrates dies made in accordance with the present invention and material being worked upon by the dies.

FIG. 1 illustrates a male die plate 10 and a female die plate 12 which cooperate to cut and crease a web of material 14 passed between them. The die plates 10 and 12 are made of a homogeneous metal material, preferably of steel or a steel alloy. The male die plate 10 includes a base portion 16 and cutting lands 18 which project therefrom. The male die plate 10 also has creasing lands 20 which project from the base 16. The female die plate 12 also has a base portion 24 and cutting lands 26 which project therefrom. The cutting lands 26 cooperate with the cutting lands 18 on the male die plate 10 to effect a cutting or severing of the material 14. The female die plate 12 also includes creasing lands 30 and 32 which define a space therebetween. The creasing land 20 on the male die plate 10 forces the material 14 between the creasing lands 30 and 32 of the female die plate as the material is advanced between the two die plates and thereby effects a creasing or scoring of the material as indicated at 34.

Figures 2, 2A, 3:
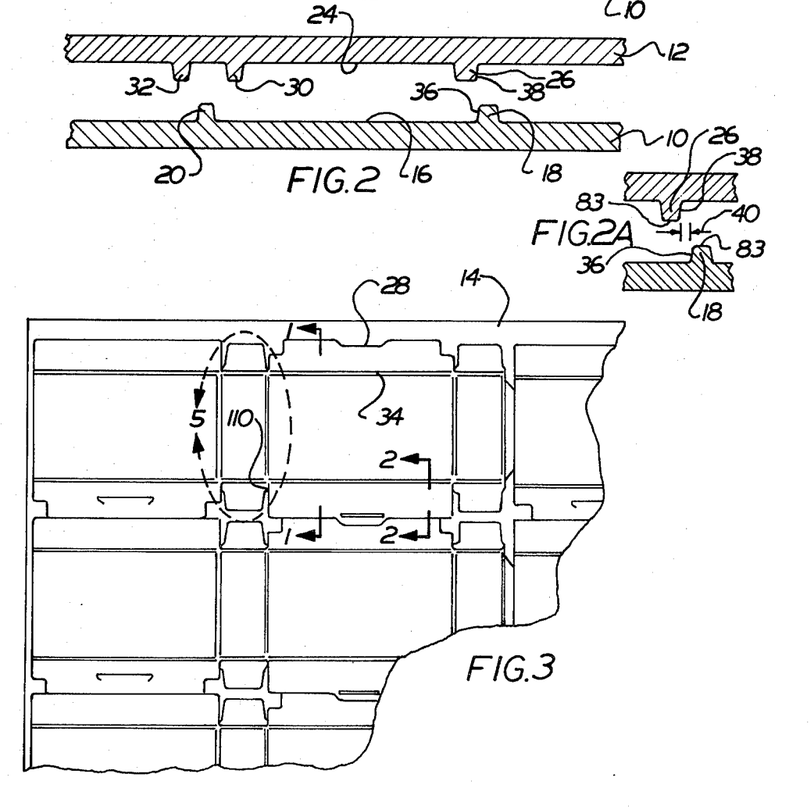
FIG. 2 illustrates a cross-sectional view of dies formed by the method of the present invention.
FIG. 3 is a line drawing of a carton to be made with dies formed according to the present invention.

As indicated in FIG. 2, the cutting or severing lands 18 and 26 are not aligned in an overlapping relationship with each other as has been done in the past. See, e.g., U.S. Pat. No. 3,170,342 issued to Downie. Rather the left edge 36 of the land 18 is aligned with the right edge 38 of the land 26 as viewed in FIG. 2. As illustrated in FIG. 2A, a slight gap 40 may be provided between the lands 18 and 26. It is preferred, if a gap 40 is provided, that it be no longer than approximately 0.002 inches. Also, the male creasing land 20 (FIG. 2) does not entirely fill the space between the two female creasing lands 30 and 32.

The correct position of the lands 18 and 26 as well as the spacing between the lands 30 and 32 and the correct width of the creasing land 20 are easily selected by those skilled in the art. Factors which must be considered in making this selection are the thickness of the material to be cut or creased and its stiffness or other physical properties. Further, as will become apparent below, the present invention eliminates the need to consider the width of the lands 18, 20, 26, 30 and 32 and the distorting effect which overwide lands may have on flat die plates which are bent to a cylindrical shape. Thus lands formed according to the present invention may be wider than those formed by prior art techniques.

The die plates 10 and 12 may be used to cut boxes or cartons from a web of material 14. FIG. 3 shows the outline of a plurality of cartons to be cut from a web of material 14. In FIG. 3 the cuts 28 which represent the outside perimeter of the cartons as well as interior cuts are represented by single lines, while, for clarity, creases 34 which form corners or folds are represented by double lines. In practicing the present invention the draftsman or designer may use a single line to represent the centerline both of cuts and of creases, and some other notation may be used to distinguish between them. Ultimately die plates 10 and 12 (FIG. 2) will be formed with the aligned edges 36 and 38 of the cutting lands 18 and 26 following the shape of the cutting lines 28 shown in FIG. 3, and the center of the creasing lines 34 will be followed by the center of the creasing land 20 (FIG. 2).

The cutting lands 18 and 26 (FIG. 1) are referred to in the art as effecting a "rupturing" of the material. The dies 10 and 12 move toward each other to operate on a sheet of paper board 14 or other similar material. However, the severing elements 18 and 26 do not come in contact with each other during the cutting of the material 14, but rather remain slightly spaced apart and affect the rupture cut of the material, as is well known in the art. The die plates 10 and 12 may be flat, but it is preferred for the die plates to be curved and mounted on cylinders so that a continuous web of material 14 may be cut or creased. Rotary presses in which the die plates 10 and 12 may be mounted are well known to those skilled in the art, and a suitable press may be easily selected by one skilled in the art.

The first step in producing die plates according to the present invention is to obtain from a draftsman or carton designer a layout similar to that shown in FIG. 3 representing the cuts and creases to be made on the web 14. The layout shown in FIG. 3 is only a fraction of the entire layout, with the balance being cut away. However, it will be understood by those skilled in the art that the layout extends for a distance equal to the complete length of the die plate and over its entire width. The number of cartons encompassed in a layout depends, of course, on their size and shape as well as the capacity of the machine in which the die plates are to be mounted.

Once a line drawing similar to that shown in FIG. 3 has been obtained, the image thereon is converted to coded information. A conventional method of doing this is the so-called and well-known digitizing process. Digitizing is a process which involves the movement of a scanner along the lines defining the pattern, and the appropriate storage information is generated as the scanner moves. An alternate, and in some respects preferable approach, is to write a computer program corresponding to the shape of the carton. In either event, the coded information which represents the line drawing of FIG. 3 is fed into the memory of an automatic machine tool 50 illustrated in FIG. 4. A suitable machine tool, known as the BostoMatic 300 n/C Milling Machine, is sold by Boston Digital Corporation of Hopkinton, Mass., 01748. As a check on the data stored, the machine tool 50 may be used to recreate the line drawing shown in FIG. 3. This is done by placing a suitable inkpen or other drawing tool where a cutting bit would normally be used.

The next step in forming die plates according to the method of the present invention is to utilize the data stored in the memory of the automatic machine tool 50 along with other information to form a master image. The master image is formed by the machine tool 50 on a well known material called Scribe Coat. This material has a transparent base layer 56 (FIG. 4A) which is highly stable and may be a plastic film or the like. On the base 56 is a coating 54 which is opaque. This material is marketed by Keuffel and Esser Company and is described in U.S. Pat. No. 2,999,016. The machine tool 50 (FIG. 4) is provided with a tool bit or scribe 52 (FIG. 4a) which removes an opaque layer 54 from a transparent substrate 56. A bit 52 having a relatively wide cutting width is used to form wider lines 62 (FIG. 5) corresponding to the creases 34 (FIG. 3), while the lines 60 (FIG. 5) representing the cutting lines 28 (FIG. 3) are made using a narrower bit. The method for determining the width of the lines 60 and 62 to be formed, and therefore the size of the cutting tool 52 (FIG. 4a) is set forth below.

Figure 4:
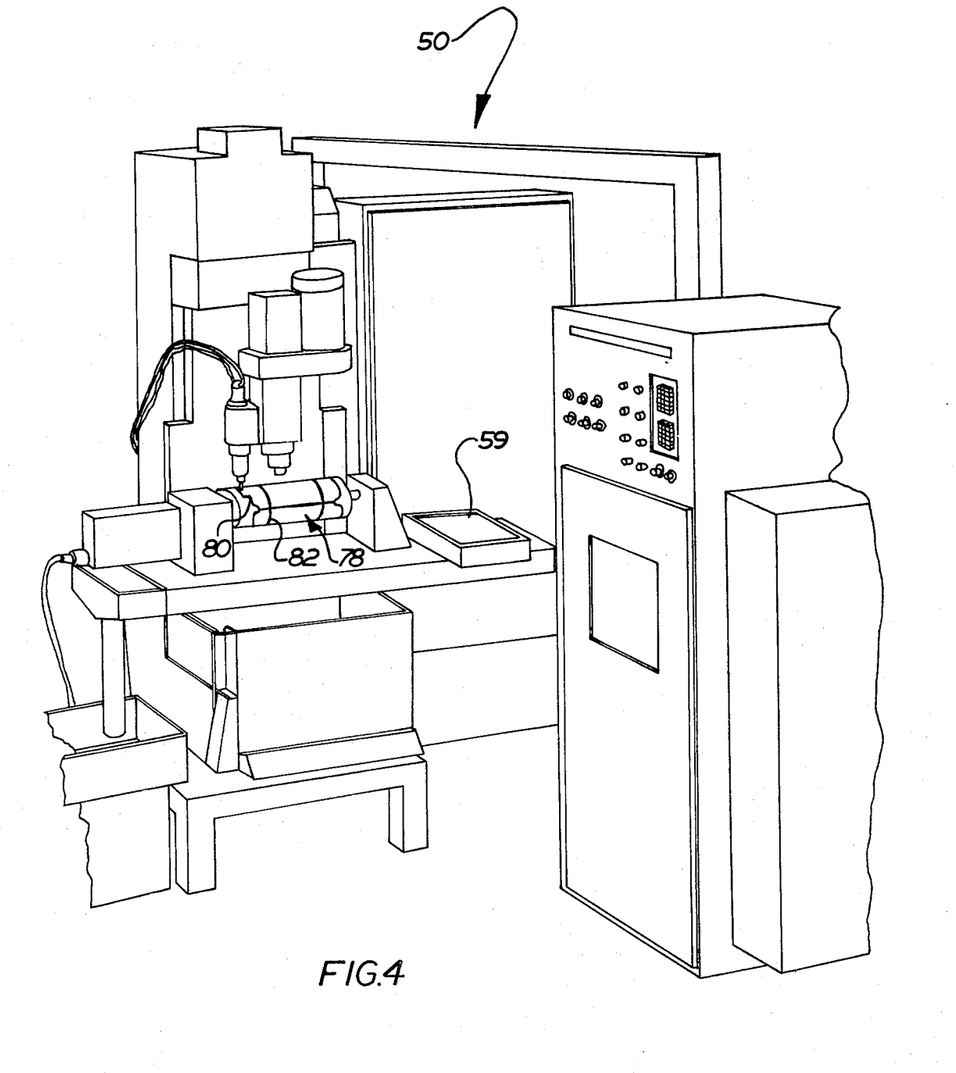
FIG. 4 is a pictorial illustration of an automatic machine tool suitable for use in practicing the method of the present invention.
Figures 4A, 5:
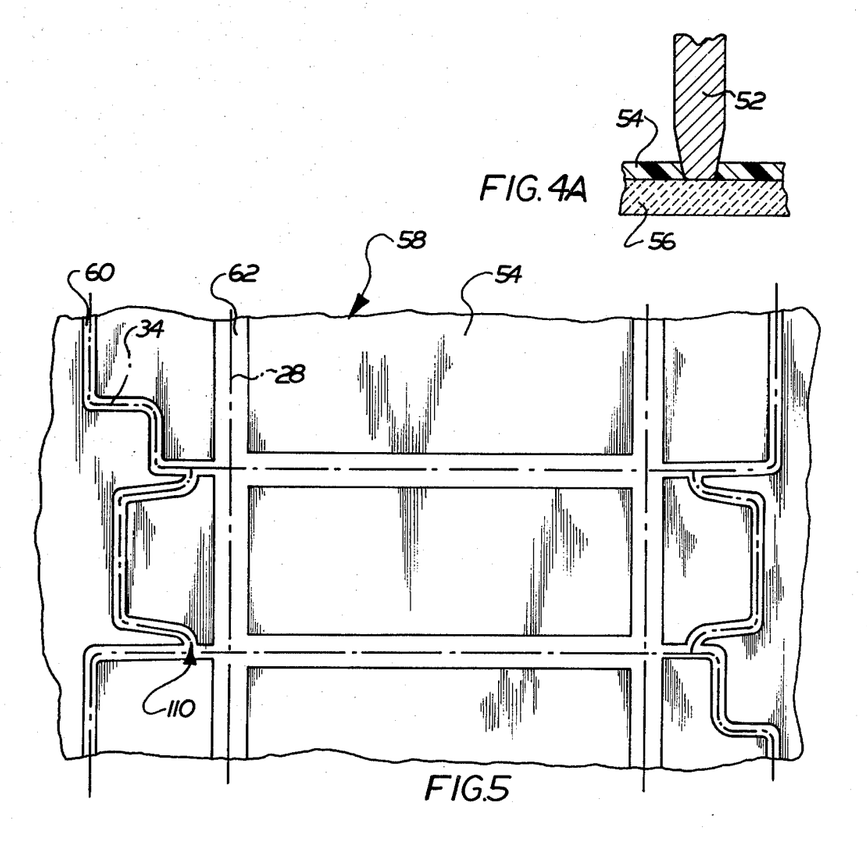
FIG. 4a illustrates a tool on the automatic machine tool of FIG. 4 removing an opaque layer from a transparent substrate to form a master image.
FIG. 5 is a plan view of a master image formed on the automatic machine tool of FIG. 4 controlled by coded information representing the line drawing of FIG. 3.

The automatic machine tool 50 (FIG. 4) forms the master image 58 according to the data stored in its memory representing center lines 28 and 34 the original layout of cuts and creases illustrated in FIG. 3 and also according to certain other data relating to the process by which the lands 18, 20, 26, 30 and 32 (FIG. 2) are formed and the material of which the die plates 10 and 12 are made. This additional data will be described more fully below. For the present purposes, it suffices to say that the scribe 52 (FIG. 4a) produces a master image 58 on a sheet of Scribe Coat which is mounted on a vacuum frame 59 (FIG. 4) on the machine tool 50. A portion of the master image 58 is shown in FIG. 5. The opaque coating 54 has been removed by the scribe 52 along lines 60 which follow the path of the cut lines 28 illustrated in FIG. 3. The opaque coating 54 has also been removed along lines 62 which follow the pattern of the crease lines 34 shown in FIG. 3.

Figure 6:
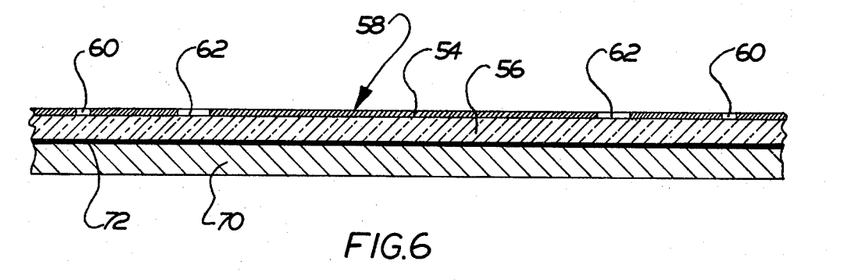
FIG. 6 is a sectional view illustrating the master image of FIG. 5 laid over a blank metal die plate which has been coated with a light hardenable resist coating.

Once the master image 58 has been formed, it is used to control the chemical etching of the die plates. In one embodiment same master image 58 is used in the preparation of both the male die plate 10 and the female die plate 12 (FIGS. 1 and 2). In order to etch the plates, a metal die plate 70 (FIG. 6) having a smooth surface is coated with a layer 72 of a light-hardenable resist, which is well known. After the die plate 70 is coated, the master image 58 is laid over the die plate and the light-hardenable resist coating 72 is exposed to light. This produces hardened areas in the coating 72 which correspond to the shapes of the pattern of cuts and creases 28 and 34 of the original layout shown in FIG. 3.

After the light-hardenable resist coating 72 (FIG. 6) on the die plate 70 has been exposed to light, the die plate is etched by a suitable etching solution. The die will be etched in the areas 74 (FIGS. 7 and 8) which have not been light hardened. The etching process reduces the thickness of the non-hardened areas of the die plates by from 0.020 to 0.100 inches. The etching also has what may be termed a "cut away" effect. In other words, the etchant acts not only on the metal of the die plate 70 directly under the non-hardened areas, but it also acts laterally on the side surfaces 76 (FIG. 8) beneath the light hardened areas and effects a reduction in the overall width of these areas. The extent of this effect is part of the above-mentioned additional data which is supplied to the memory of the automatic machine tool 50 (FIG. 4). This data takes the form of the ratio of the rate of side etching to the rate of downward etching for a selected metal die plate 70 (FIG. 6) and a particular etching solution. In practice this ratio has been found to be about one-half.

Figure 7:
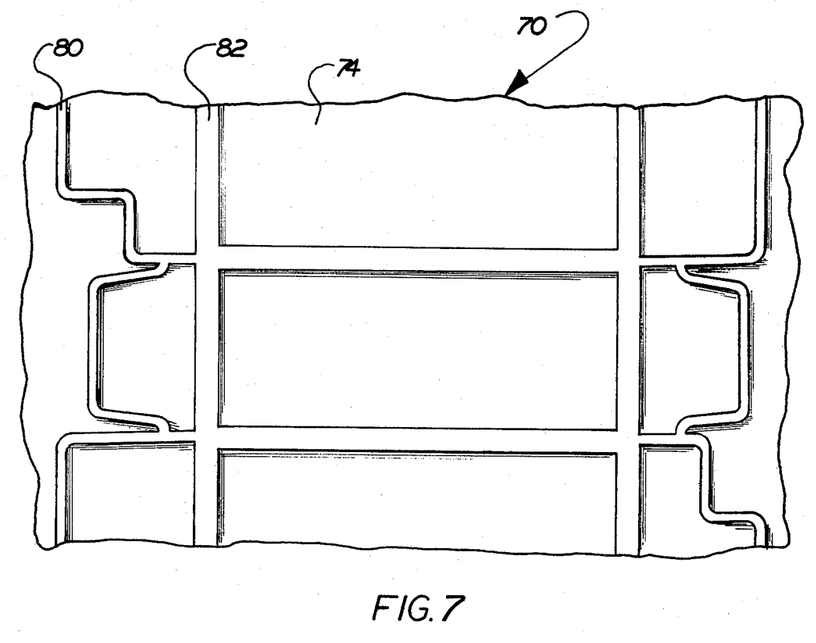
FIG. 7 is a plan view of a die plate after it has been exposed through the master image of FIG. 5 and etched by a chemical etching process.

The master image 58 (FIGS. 5 and 6) is used to form two identical die plates, a portion of one of which is shown in FIG. 7. However, as is clear from FIGS. 1 and 2, the male and female die plates 10 and 12 are not identical. While the raised portions 80 and 82 of the etched die plate shown in FIG. 7 follow the path of the cutting and creasing lines 28 and 34 of the layout illustrated in FIG. 3, they do not have the separate shapes of the lands 18, 20, 26, 30 and 32 which form the cuts 28 and creases 34. In order to convert the raised portions 80 and 82 (FIG. 7) into the desired cutting and creasing lands shown in FIGS. 1 and 2, material is selectively removed from the sides of the raised portions. This is accomplished using the automatic machine tool 50 fitted with a proper cutting tool bit.

The tool bit is used to form lands whose sides 84 and 85 (FIG. 10) converge toward each other in the direction of the top 83 of the land 18. The sides are each inclined 10° from a perpendicular to the base 74. Further, the tool bit rounds or chamfers the corners 86 slightly. The combination of the rounded corners 86 and the tapered sides 84 and 85 reduces sticking of the material 14 (FIG. 1) to the die plates 10 and 12, reduces the production of slivers of material, and enhances the rupture cutting process.

It has been found that the tool bit need not reach all the way down to the base 74 of the die plate, and it is preferred to allow one or two thousandths of an inch clearance between the bottom of the cutting tool and the base of the die plate. In addition, the spacing 40 (FIG. 2a) between cooperating lands 18 and 26 can be decreased by removing material from the tops 83 (FIG. 10) of the lands if they have a trapezoidal cross section. If the lands are machined with an initial spacing 40 and if it is found during trial runs that it is desirable to reduce this spacing, this can be easily accomplished by grinding or machining some thickness of material off the tops 83 of the lands 18 and 38.

The die plates 10 and 12 may be flat die plates used in a stamping-type press. Or, the die plates 10 and 12 may be cylindrical and used in a rotary press. In the latter case, there are distinct advantages to producing the cutting and creasing lands on the die plates "in the round", that is with the die plates curved to the same cylindrical shape that they will be in the press. In prior art techniques, die plates have been made flat and then curved to a cylindrical shape. In doing so, care had to be taken to produce cutting and creasing lands that were as narrow as possible and which stood above the base portion of the plates as little as possible. This was necessary to prevent distortion of the die plates when they were bent to the shape in which they were used. According to the present invention, the die plates may be machined in the round. This permits the lands to be wider than in prior plate making techniques and permits them to be wider. There are no distortion problems that arise from bending because the plates are curved to the configuration in which they will be used prior to machining of the lands.

Figure 8:
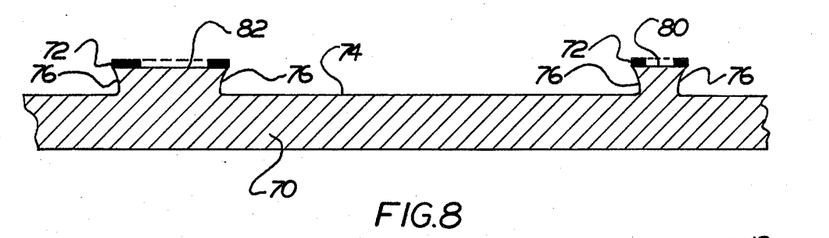
FIG. 8 is an enlarged sectional view of a portion of the die plate illustrated in FIG. 7 showing a coating of light hardenable material on its surface and downward and sideways chemical etching.

FIG. 4 shows a cylindrical die plate 78 mounted in the automatic machine tool 50 ready for selective removal of material from the sides of the raised portions 80 and 82. The coded information used to control the formation of the master image 58 (FIG. 5) is also used to control the automatic machine tool 50 in machining the lands 80 and 82 (FIG. 8). In addition to coded information representing the path of the desired cuts 28 and creases 34 (FIG. 3) the automatic machine tool 50 is provided with coded information which represents the desired width of the cutting lands 18 and 26, and the desired amount of spacing 40 (FIG. 2a), if any, between them. Similarly, the machine 50 is provided with information representing the desired width of the creasing lands 20, 30, and 32 as well as the size of the space between the creasing lands 30 and 32. With this information, when the automatic machine tool 50 (FIG. 4) has been equipped with an appropriate bit or cutting tool, it will remove the material from the sides of the raised portions 80 and 82. Material removed is shown at 92, 93, 94, 95, 96, 97, 98, 99 and 100 in FIG. 9.

As discussed above, during the etching process, the etchant eats away metal from the die plate 70 (FIG. 8) in the areas 74 where the die plate is not covered by hardened resist 72. It also forms undercuts 76 under the resist material 72. The result of the undercuts 76 is that the raised portions 80 and 82 which remain after the etching process are narrower in width than the coating of resist 72. The extent of this narrowing is compensated for by measuring the ratio between the rate at which the etchant eats sideways or edgewise to form the undercut 76 to the rate at which it eats directly downward into the material of the die plate 70. This ratio is termed the side etch correction factor.

Figure 9:
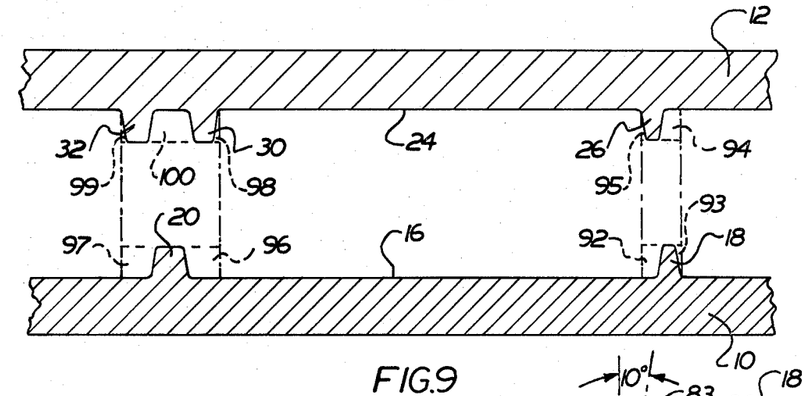
FIG. 9 is a sectional view of a pair of die plates each of which was originally similar to that of FIG. 5 after one has been milled in the machine tool of FIG. 4 to form a male die plate and the other has been milled to form a female die plate.

The side etch correction factor is utilized in the following way in forming cutting lands 18 and 26 (FIG. 10): First the desired width of the lands 18 and 26 (FIG. 9) and the spacing between them, if any, is selected. These dimensions depend upon the material being cut and can be determined easily by those skilled in the art. It is also necessary to choose the height above the bases 16 and 24 of the male and female die plates, respectively, it is desired for the lands 18 and 26 to extend. It is preferred to have the lands extend between 0.02 and 0.1 inches up from the base of the die plates. (Machining in the round enables die plates with such high profile lands to be made accurately.) The width of the raised portion 80 which it is desired to produce in the unmachined die plate 70 (FIG. 9) is next calculated by adding together the desired width of the land 18 with the desired width of the land 26 and adding the amount of spacing 40 (FIG. 2a), if any. Next, in order to determine how wide the strip 72 (FIG. 8) of hardened resist must be in order to produce a raised portion 80 of the width calculated in the preceding step, it is necessary to increase the width of the resist material 72 to an extent which will compensate for the undercutting of the etchant on the side 76 of the land 80. Since the ratio of sideward etching to downward etching has been previously determined, and since the depth of etching has already been selected, one need only multiply the selected depth by the ratio of side to downward etching to determine the extent of sideward etching which will occur during a given selected extent of downward etching. Since this sideward occurs on both sides of the raised portion 80, the product determined in the previous step is doubled and then added to the desired width of the raised portion 80. The result of this sum determines the line width of the line 60 (FIG. 5) and the strip 72 (FIG. 8) of hardened resist which conform to the shape of the cutting lines 28. This line width is supplied as part of the coded information fed to the automatic machine tool 50 and is processed to control the scribe 52 (FIG. 4a).

In a similar manner it is possible to calculate what width of line 62 (FIG. 5) is necessary in order to produce lands 30 and 32 (FIG. 10) which are spaced a certain distance apart.

Figure 10:
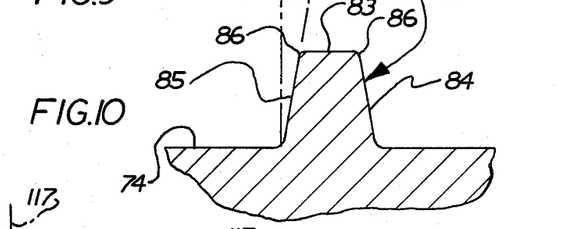
FIG. 10 is an enlarged view of a cutting land of FIG. 9.

Once the raised portions 80 and 82 have been etched to the proper width and depth, the die plate is mounted in the automatic milling machine (FIG. 8) and material is milled away from the sides of the raised portions 80 and 82 to produce the desired lands 18 and 20 on one die plate and the corresponding lands 26, 30 and 32 on the other die plate 12 (FIG. 10).

As a final step in the machining on the automatic machine tool 50 (FIG. 8), special machining takes place at crossovers. Crossovers occur where two cutting lands intersect each other as at 110 in FIGS. 3 and 5. This special machining is necessary in order to prevent the material 14 from being crushed by overlapping cutting lands in the area where the cutting lands intersect.

Figure 11A:
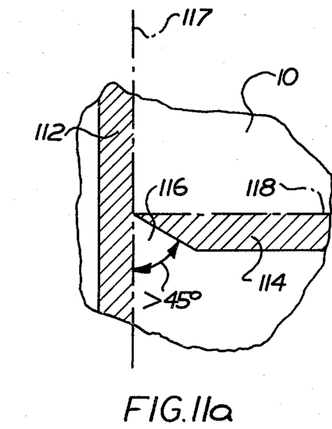
FIGS. 11a and 11b are plan views of male and female die plates illustrating special cuts made on the automatic machine tool of FIG. 4 where two cutting lines intersect.

To accomplish this special machining a bit or cutting tool which has a cutting face beveled at 45° to its axis of rotation is mounted in the machine tool 50. The intersection 110 is formed by the joining of cutting lands 112 and 114 (FIG. 11a) on male die plate 10. On the male die plate, land 112 is relieved as indicated at 116. The beveled cutting tool is used to reduce the width of the land 114, but the land 112 is not modified. In plan view the face of the relieved portion 116 forms an angle of more than 45° with the centerline 117.

Figure 11B:
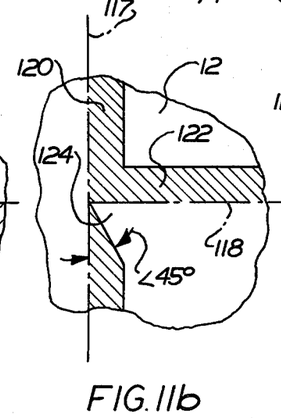

On the female die plate 12 (FIG. 11b), the intersection 110 is formed by the joining of cutting lands 120 and 122. Land 122 cooperates with land 114 to cut material pressed between them along centerline 117, and similarly land 112 cooperates with land 120 to cut material along centerline 118. In machining a female die plate 12 in the area of the intersection 110, the same beveled cutter is utilized but only the land 120 is relieved as indicated at 124. In a plan view the face of the relieved portion 124 forms an angle of less than 45° with centerline 117.

Figure 12:
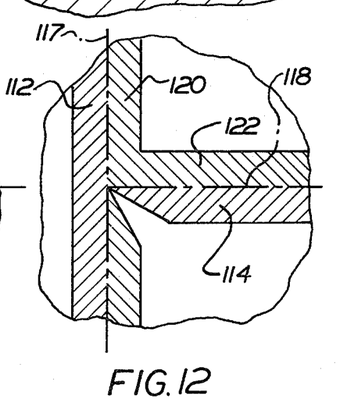
FIG. 12 is a drawing superimposing the profiles of the top surfaces of the cutting lands of FIGS. 11a and 11b.

In FIG. 12 die plate 12 is shown superimposed on die plate 10. Only the outlines of the top surfaces of the cutting lands 112, 114, 120 and 122 are shown in FIG. 12. It is clear from FIG. 13 that if the machining had not been done at 116 and 124, there would be overlap between the lands 120 and 114 in the area of the intersection. If this overlap had been allowed to remain, the material to be cut would have been crushed and improper cutting would have resulted in this area. Relieving the die plates 10 and 12 (FIGS. 11a and 11b) at 116 and 124 permits cutting along lines 117 and 118 to continue right up to their intersection.

It should be noted that the present invention may be practiced to provide die plates 10 and 12 (FIGS. 1 and 2) which are in the form of thin shells to be attached to cylinders in a web treating machine. It is also possible to practice the present invention directly on the cylinders themselves. This may be desirable when a substantial run of cartons is to be made. In such longer runs, the increased cost of producing an entire cylinder with the cutting and creasing lands formed directly thereon may be worthwhile. Accordingly, it is to be understood that as used in this specification and the appended claims the term "die plate" is used generically to include not only die plates which are attached to cylinders in press, but also etched and machined surfaces formed directly in the surface of a cylinder or cylinder segment and equivalent structures.

It is also contemplated that the method of the present invention can be carried out by forming two master images, one for each die plate. Although this second embodiment of the present invention requires the additional step of making a second master image, the lines scribed on each image are more nearly the width of the finished lands. This provides an advantage in that less material must be removed by machining.

Figure 13:
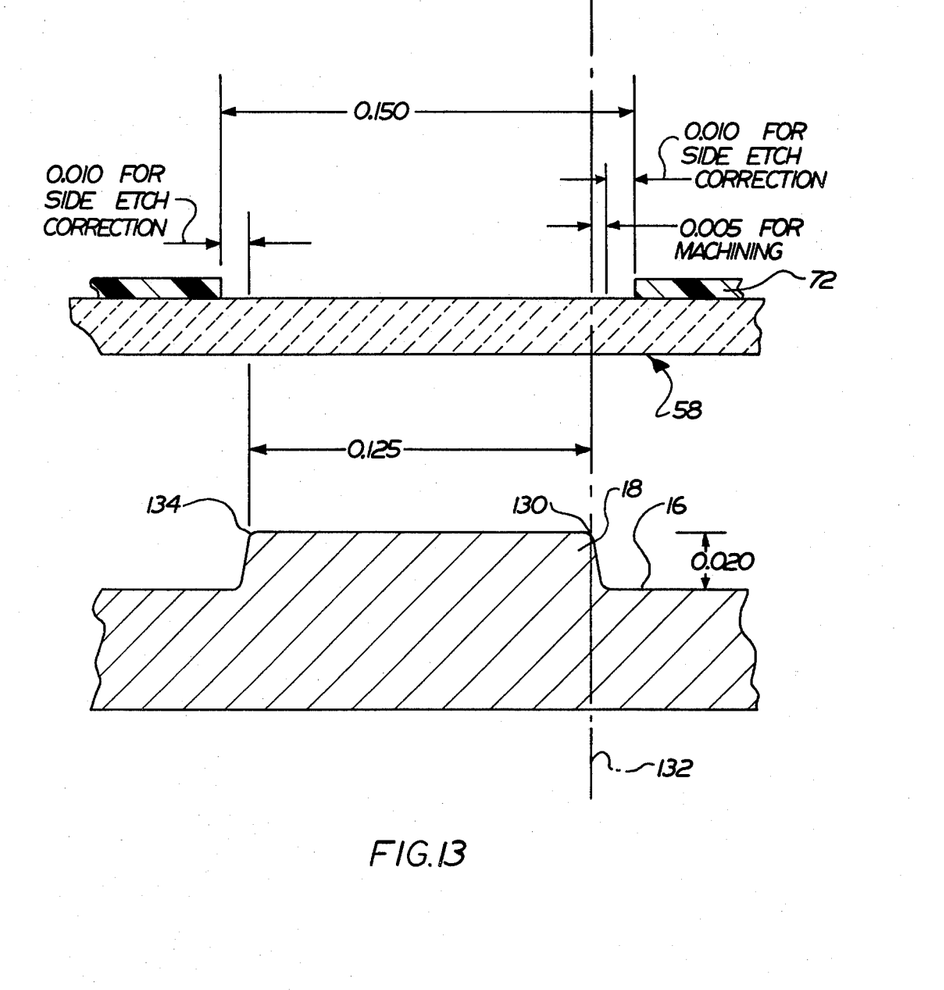
FIG. 13 illustrates an example of a calculation of the width of line to be formed in a master image to obtain a desired width land according to a second embodiment of the present invention.

If two master images are made, one for each die plate, male 10 and female 12 (FIG. 1), the width of each line to be scribed on each master image can be calculated as follows with reference to FIG. 13 which shows land 18 on male die plate 10 and Scribe Coat 58 aligned with it: Suppose it is desired to make a land 18 which rises 0.020 inches from the base 16 of the die plate 10 and that the land is to be 0.125 inches wide at its top. Suppose further, that the ratio of the rate of side etching to the rate of downward etching is $\frac{1}{2}$. Finally, it has been found desirable to allow approximately 0.005 inches for machining. The machining allowance of 0.005" is provided on one side only because, while the relationship of the corner 130 relative to the cut line 132 must be exact, there is no need for such precision in locating corner 134. To produce the above-described land 18, the width of the line to be formed in the Scribe Coat to make a master image is given by:

$$0.125 + 0.005 + 2[\tfrac{1}{2}(0.020)] = 0.150$$

In this equation the "0.125" is the desired land width; the "0.005" is additional material provided for machining in the final step of producing the die plate. In the final term, the depth of the etching (0.020) is multiplied by the side etch corrosion factor ($\tfrac{1}{2}$) to determine the extent of side etching for the selected depth, and this product is doubled because side etching will occur on both sides of the land 18. The centerline of the cut to be formed by this land is located 0.015 inches from one edge of the line scribed in the Scribe Coat 58 and 0.135 inches from the other edge.

Thus, it is clear that the present invention utilizes an automatic machine tool 50 (FIG. 4) to produce die plates 10, 12 (FIG. 1) efficiently and rapidly. Once a designer has produced a line drawing (FIG. 3) of a carton to be made, the layout is converted to coded information which may be stored in the memory of the automatic machine tool 50 (FIG. 4). Additional coded information related to the chemical etching process used to make the die plates, where material is to be cut, and where it is to be creased is added to the memory. The machine tool 50 is then used to scribe a master image 58 (FIG. 5) by selectively removing an opaque coating 54 (FIG. 6) from a transparent substrate 56. The width of the lines scribed in the master image 58 is selected according to the types of cut or crease to be formed, the nature of the paperboard to be cut or creased, and the chemical properties of the material of which the die plates are formed.

A pair of blank metal die plates 70 are then coated with a light hardenable material 72, the master image 58 is laid over each plate, and then each plate is exposed through the master image. The coating 72 is hardened by this exposure in the areas 62 and 64 where the opaque layer 54 has been removed, but elsewhere it remains soft. The exposed plates are then chemically etched, with the etchant effective to remove material from the plate only in those areas where the light hardenable coating was not exposed. Raised portions corresponding to the line drawing thus remain raised above the surface of the die plates while the balance of the surfaces are etched downward. Thereafter the same coded information is used to control the automatic machine tool 50 (FIG. 4) to selectively remove material at 92, 93, 95, 96, 97, 98, 99 and 100 (FIG. 9) from the lands 18, 26, 20, 30 and 32, respectively, to turn the heretofore identical pair of die plates 10, 12 into a male and female die plate. This automatic machine tool 50 finishes the dies by removing material from the sides of the lands to produce the desired profile for the lands, the proper spacing between cooperating cutting lands, and the proper spacing between cooperating creasing lands. The automatic machine tool 50 may also be utilized to make special cuts 116, 124 (FIGS. 11a, 11b, and 12) where the cutting lines intersect each other.

In an alternative embodiment of the present invention, a separate master image is made for each of a pair of cooperating die plates, i.e., one image for the male die plate and one for the female die plate. In this case the machine tool 50 (FIG. 4) has less material to remove from the lands after they have been etched in order to form the finished lands with the desired spacing and profile.

What is claimed is:

1. A method of forming accurately located lands on an opposing pair of die plates, the lands cooperating to cut material pressed between the die plates in regions where the lands on one die plate are positioned in a predetermined relationship with the lands on the opposite die plate, said method comprising the steps of forming a master image having lines representing the lands to be formed on both die plates, the lines in said master image having a width exceeding by a predetermined amount a desired width of the cooperating lands on the die plates, utilizing the master image to directly control exposure of a resist on the surface of the two die plates, chemical etching of the surface of the two die plates until raised portions configured the same as the lines of said master image are formed on each die plate, and thereafter selectively removing material from at least one side of the raised portions on each plate until the lands of each plate are formed.

2. A method as set forth in claim 1 wherein said step of chemically etching the plates includes the step of chemically etching metal plates, and said step of forming a master image includes the steps of determining said predetermined amount by which the width of the lines in the master image exceeds the desired width of the cooperating lands by selecting a desired height for the sides of the lands, determining the ratio between the extent of side etching and the extent of downward etching which occurs during said step of chemically etching the metal plate, multiplying the ratio so determined by the height so selected, and adding the product of said multiplication the desired width of the cooperating lands.

3. A method as set forth in claim 1 wherein said step of forming a master image includes the steps of providing coded information representing the configuration of the center line of the lines to be formed in the line drawing and utilizing said coded information to an automatic machine tool equipment to produce the master image, and further including the step of utilizing said coded information to control said automatic machine tool to perform said step of selectively removing material from the sides of the lands on each plate until the lands of each plate are formed.

4. A method as set forth in claim 1 wherein said steps of forming a master image and utilizing the master image to control etching of lands include the steps of providing a sheet having a light transmitting base and an opaque coating thereon, providing coded information representing the configuration of the center lines of the lines to form said master image, making said master image by utilizing said coded information to control automated drawing equipment to form light transmitting lines on said sheet in accordance with the coded information, exposing a light hardenable resist coating on the plates to light through said master image to harden lines of said resist coating on said plate in accordance with the light transmitting lines on said sheet, and etching said plates in the unhardened areas thereof to produce said lands.

5. A method as set forth in claim 4 further including the step of utilizing said coded information to control an automatic machine tool to perform said step of removing material from the sides of the lands on each plate until the lands of each plate are formed.

6. A method as set forth in claim 1 further including the step of forming a male creasing land on one of die plates, and cooperating female creasing lands on the other one of die plates, said male land being adapted to fit between said pair of female lands to effect creasing of a material pressed between the die plates, said step including the steps of selecting a desired width of the female creasing lands, determining the desired spacing between said pair of female lands, calculating a maximum creasing land width by adding the spacing determined in the preceding step to twice the desired width of the female creasing lands, determining a creasing land line width by adding a predetermined side etch correction factor to the calculated maximum creasing land width, selecting a desired pattern of creases, providing coded information representing the pattern so selected, providing coded information representing the creasing land line width, and utilizing the coded information representing the desired creasing pattern and the creasing land line width to form a pattern of lines on a master image corresponding to the desired pattern of creases, each of the lines so formed having a width equal to the creasing land line width, chemically etching the pair of die plates to form raised portions having widths equal to the maximum creasing land width, and thereafter selectively removing material from the sides of the raised portions which have a width equal to the maximum creasing land width by a metal cutting tool controlled by said coded information to thereby form a male creasing land on one die plate and a cooperating pair of female lands on the other.

7. A method as set forth in claim 1 wherein said step of selectively removing material from at least one side of the raised portions includes the steps of bending the die plates to conform to at least a portion of a cylindrical surface, mounting the die plates in an automatic machine tool while maintaining the die plates in the shape to which it has been bent, and thereafter utilizing the machine tool movement to remove material from at least one side of the raised portions of the die plate.

* * * * *